(12) United States Patent
Akarvardar et al.

(10) Patent No.: US 9,570,588 B2
(45) Date of Patent: Feb. 14, 2017

(54) METHODS OF FORMING TRANSISTOR STRUCTURES INCLUDING FORMING CHANNEL MATERIAL AFTER FORMATION PROCESSES TO PREVENT DAMAGE TO THE CHANNEL MATERIAL

(71) Applicant: GLOBALFOUNDRIES Inc., Grand Cayman (KY)

(72) Inventors: Murat Kerem Akarvardar, Saratoga Springs, NY (US); Steven Bentley, Menands, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/883,045

(22) Filed: Oct. 14, 2015

(65) Prior Publication Data

US 2016/0190289 A1    Jun. 30, 2016

Related U.S. Application Data

(60) Provisional application No. 62/097,390, filed on Dec. 29, 2014.

(51) Int. Cl.
*H01L 29/66* (2006.01)
*H01L 21/306* (2006.01)
*H01L 21/3213* (2006.01)

(52) U.S. Cl.
CPC ... *H01L 29/66795* (2013.01); *H01L 21/30604* (2013.01); *H01L 21/32134* (2013.01); *H01L 29/66545* (2013.01)

(58) Field of Classification Search
None
See application file for complete search history.

(56) References Cited

U.S. PATENT DOCUMENTS

| | | | | |
|---|---|---|---|---|
| 2005/0224879 A1* | 10/2005 | Xiang | ........ | H01L 29/7842 257/347 |
| 2011/0212600 A1* | 9/2011 | Wang | ........ | H01L 21/02381 438/478 |
| 2013/0045580 A1* | 2/2013 | Cho | ........ | H01L 21/823431 438/296 |

(Continued)

OTHER PUBLICATIONS

Colinge et al., "Nanowire Transistors without Junction", Nature Nanotechnology, Feb. 21, 2010, DPO: 10.1038/NNANO.2010.15, 5 pages.

*Primary Examiner* — Michael Jung
*Assistant Examiner* — Jay C Chang
(74) *Attorney, Agent, or Firm* — Heslin Rothenberg Farley and Mesiti PC; Nicholas Mesiti (57) ABSTRACT

Methods for fabricating transistor structures are provided, the methods including: forming a fin structure with an upper fin portion and a lower fin portion, the upper fin portion including a sacrificial material; forming a gate structure over the fin; selectively removing the upper fin portion to form a tunnel between the gate structure and lower fin portion; and providing a channel material in the tunnel to define the channel region of the gate structure. The sacrificial material may be a material that can be selectively etched without etching the material of the lower fin portion. The channel material may further be provided to form source and drain regions of the transistor structure, which may result in a junctionless FinFET structure.

19 Claims, 9 Drawing Sheets

(56) References Cited

U.S. PATENT DOCUMENTS

| | | | |
|---|---|---|---|
| 2013/0234203 A1* | 9/2013 | Tsai | H01L 29/66795 257/190 |
| 2013/0270628 A1* | 10/2013 | Huang | H01L 29/0847 257/329 |
| 2014/0264632 A1* | 9/2014 | Richter | H01L 29/66795 257/401 |

* cited by examiner

METHODS OF FORMING TRANSISTOR STRUCTURES INCLUDING FORMING CHANNEL MATERIAL AFTER FORMATION PROCESSES TO PREVENT DAMAGE TO THE CHANNEL MATERIAL

CROSS-REFERENCE TO RELATED APPLICATION

This application claims the benefit of U.S. Provisional Patent Application No. 62/097,390, filed Dec. 29, 2014, which is hereby incorporated herein by reference in its entirety.

FIELD OF THE INVENTION

The present invention relates to integrated circuits and to methods of fabricating transistor structures, and more particularly, to methods of forming channel regions of transistor structures.

BACKGROUND OF THE INVENTION

Transistor structures frequently make use of silicon as a channel material, but alternative channel materials, such as silicon-germanium and III-V materials, have been considered for improving transistor performance and efficiency. However, several issues persist with integrating such alternative channel materials into transistor structure fabrication processes, which may result in the channel material being damaged, contaminated, or destroyed by certain fabrication techniques.

BRIEF SUMMARY

Various shortcomings of the prior art are overcome, and additional advantages are provided through the provision, in one aspect, of a method of facilitating fabricating a transistor structure, the facilitating fabricating including: forming a fin above a substrate, the fin having a lower fin portion and an upper fin portion, the upper fin portion including a sacrificial material; forming a gate structure over the fin; selectively removing the upper fin portion, the selectively removing forming a tunnel between the gate structure and the lower fin portion; and providing a channel material in the tunnel, the channel material forming a channel region of the gate structure.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting examples illustrated in the accompanying drawings. Descriptions of well-known materials, fabrication tools, processing techniques, etc, are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Silicon is often used as a channel material in metal-oxide semiconductor (MOS) transistors, such as metal-oxide semiconductor field-effect transistors (MOSFETs), but alternative channel materials have been considered recently to improve transistor performance and efficiency. For example, germanium and silicon-germanium (SiGe), as well as III-V materials such as gallium-arsenide (GaAs), may be desirable channel materials that can, for example, improve carrier mobility in the channel. However, there are several issues with integrating such alternative channel materials into existing process flows. For example, thermal processing used in forming other circuit structure components, such as gate structures or replacement metal gate (RMG) structures, may require temperatures that melt alternative channel materials. As well, cross-contamination of manufacturing tools or materials from different circuit structures may also occur, and III-V materials may be especially susceptible to such cross-contamination.

Thus, such alternative channel materials should ideally be added to circuit structures as late as possible within a circuit structure fabrication process to avoid exposing the channel material to other processes that may damage, contaminate, or destroy the material, as well as exposing the channel material to a minimum number of manufacturing tools. However, circuit structure fabrication processes generally require formation of the channel early and before formation of other structures, usually prior to gate structure formation because gate structures generally are formed over or around the channel, leaving alternative channel materials vulnerable to later processes that may damage them.

Thus, generally stated, provided herein in one aspect is a method of facilitating fabricating a transistor structure, the facilitating fabricating including: forming a fin above a substrate, the fin having a lower fin portion and an upper fin portion, the upper fin portion including a sacrificial material; forming a gate structure over the fin; selectively removing the upper fin portion, the selectively removing forming a tunnel between the gate structure and the lower fin portion; and providing a channel material in the tunnel, the channel material forming a channel region of the gate structure.

In one exemplary embodiment, the channel material may also be provided over a first part of the lower fin portion, external a first side of the gate structure, and over a second part of the lower fin portion, external a second side of the gate structure, so that the channel material over the first part of the lower fin portion forms a source region of the transistor structure and the channel material over the second part of the lower fin portion forms a drain region of the transistor structure, the source region and drain region each contacting the channel region. The channel material that includes the source region, drain region, and channel region may form, in part, a junctionless FinFET structure. In a junctionless transistor, source, drain, and channel are made of the same material, such as a homogeneous doped material, and channel conductance may be modulated by depletion regions induced by a gate voltage. For a scaled fin with a width of about 10 nm or less, full depletion may be possible, even in the case of a heavily doped channel, so that drain current may be completely cut off. Junctionless device architectures may be compatible with one or more embodiments of the methods described herein due to the access regions (i.e., the source and drain regions) being made of the same material as the channel region.

In another exemplary embodiment, the gate structure may be a replacement metal gate structure (RMG), and selectively removing the upper fin portion may be performed after formation of the replacement metal gate structure. In an alternative embodiment, the gate structure may be a sacrificial gate structure, and the method may include removing the sacrificial gate structure and providing a replacement metal gate structure after selectively removing the upper fin portion and replacing it with the alternative channel material.

Reference is made below to the drawings, which are not drawn to scale for ease of understanding, wherein the same reference numbers used throughout different figures designate the same or similar components.

Figure 1:
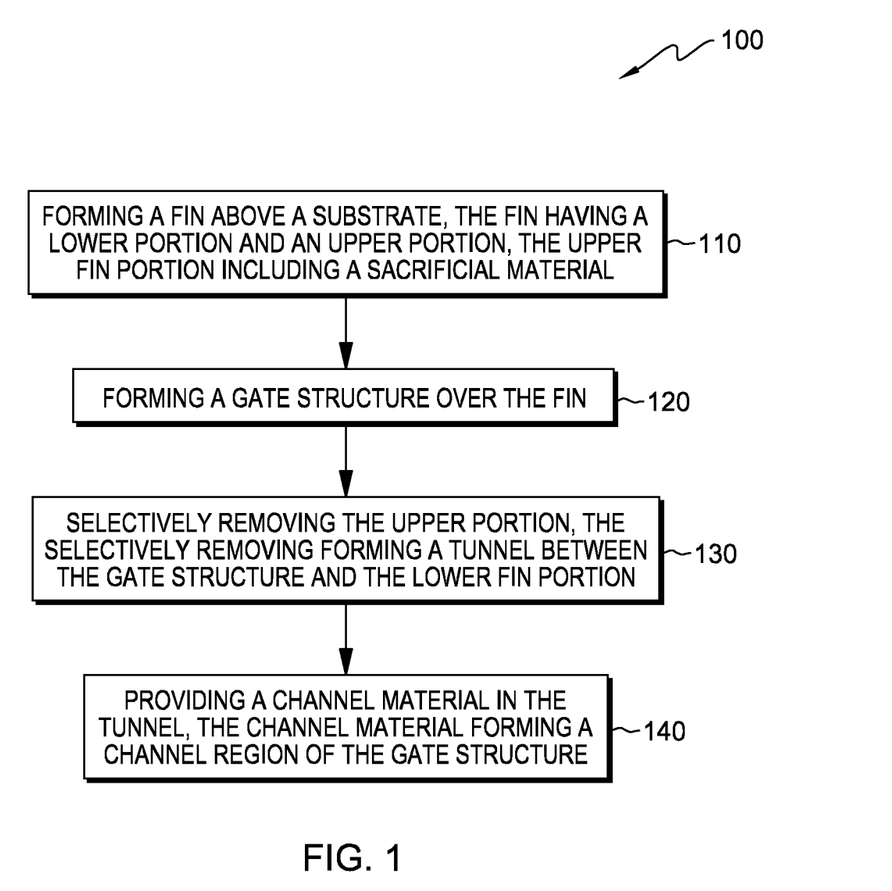
FIG. 1 outlines a process for facilitating fabricating a transistor structure, in accordance with one or more aspects of the present invention.

By way of summary, FIG. 1 illustrates one embodiment of a process 100 for facilitating fabrication of a circuit structure, in accordance with one or more aspects of the present invention. In the embodiment illustrated, the process 100 includes, for example: forming a fin above a substrate, the fin having a lower fin portion and an upper fin portion, the upper fin portion including a sacrificial material 110; forming a gate structure over the fin 120; selectively removing the upper fin portion, the selectively removing forming a tunnel between the gate structure and the lower fin portion 130; and providing a channel material in the tunnel, the channel material forming a channel region of the gate structure 140.

Figure 2A:
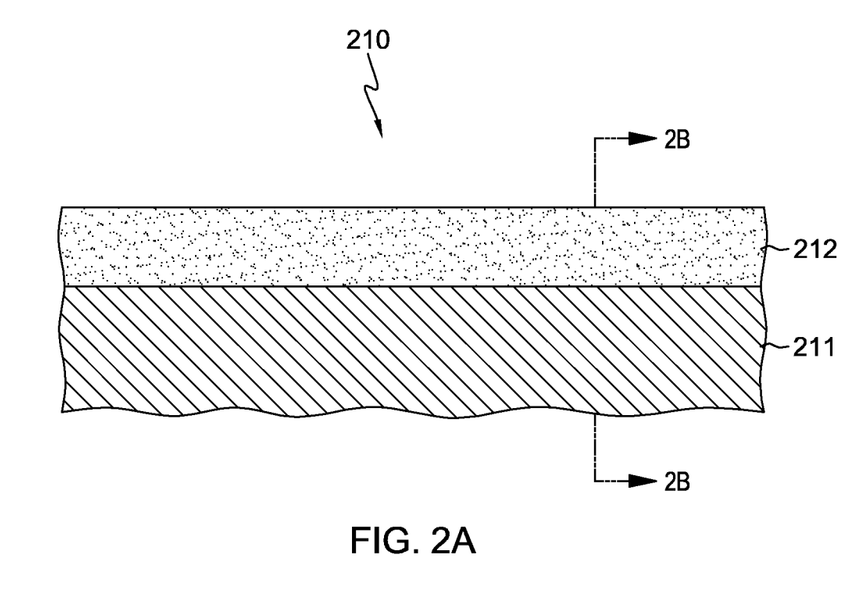
FIGS. 2A-2P depict one embodiment of a process for forming a channel region of a transistor structure, in accordance with one or more aspects of the present invention.
Figure 2B:
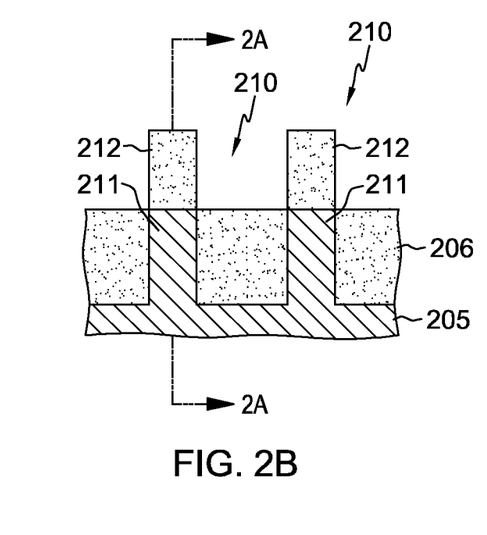
Figure 2C:
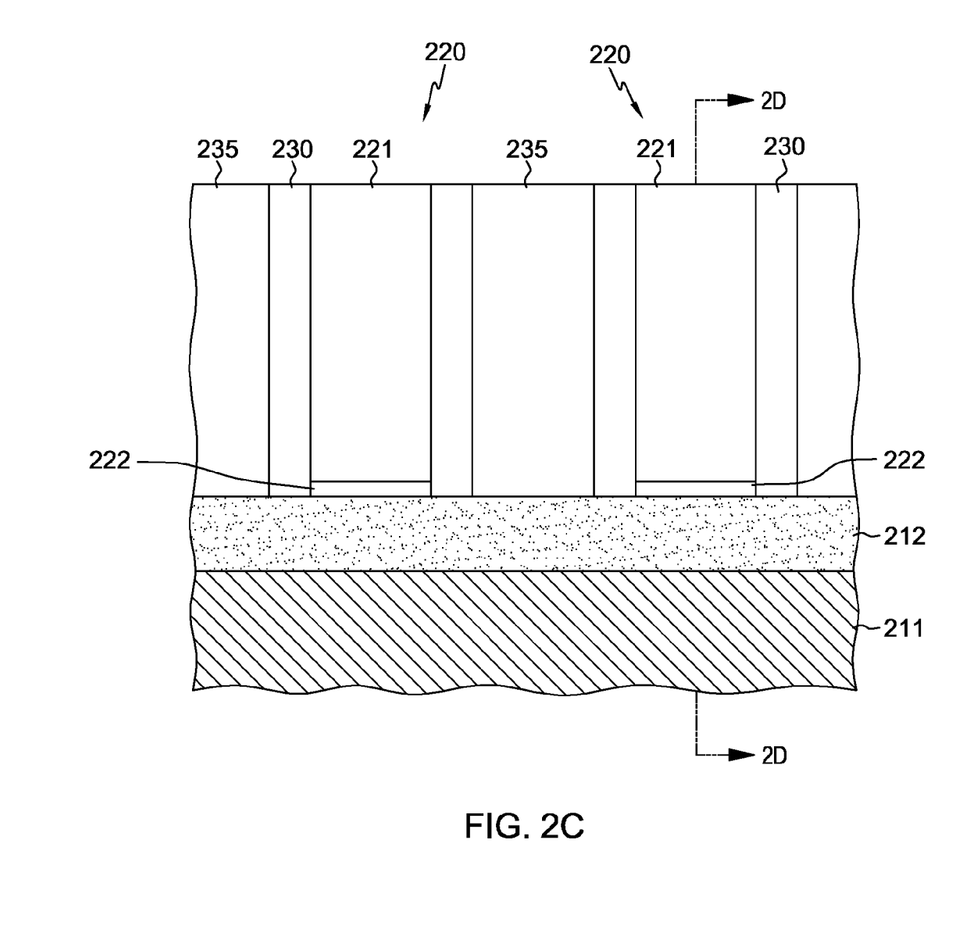
Figure 2D:
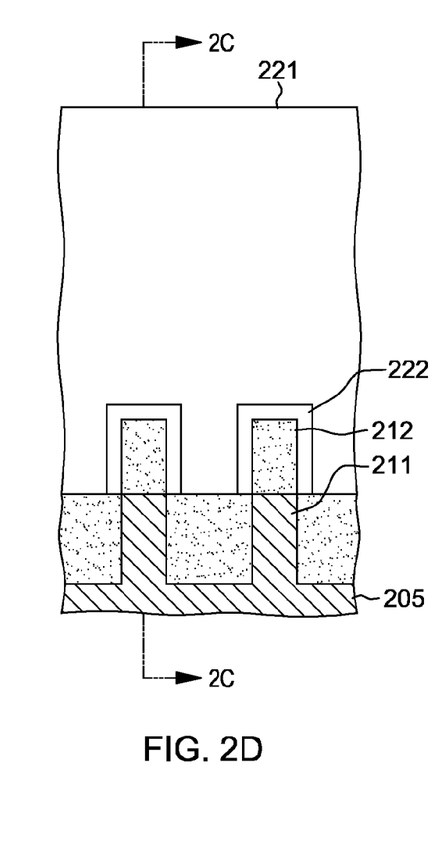
Figure 2E:
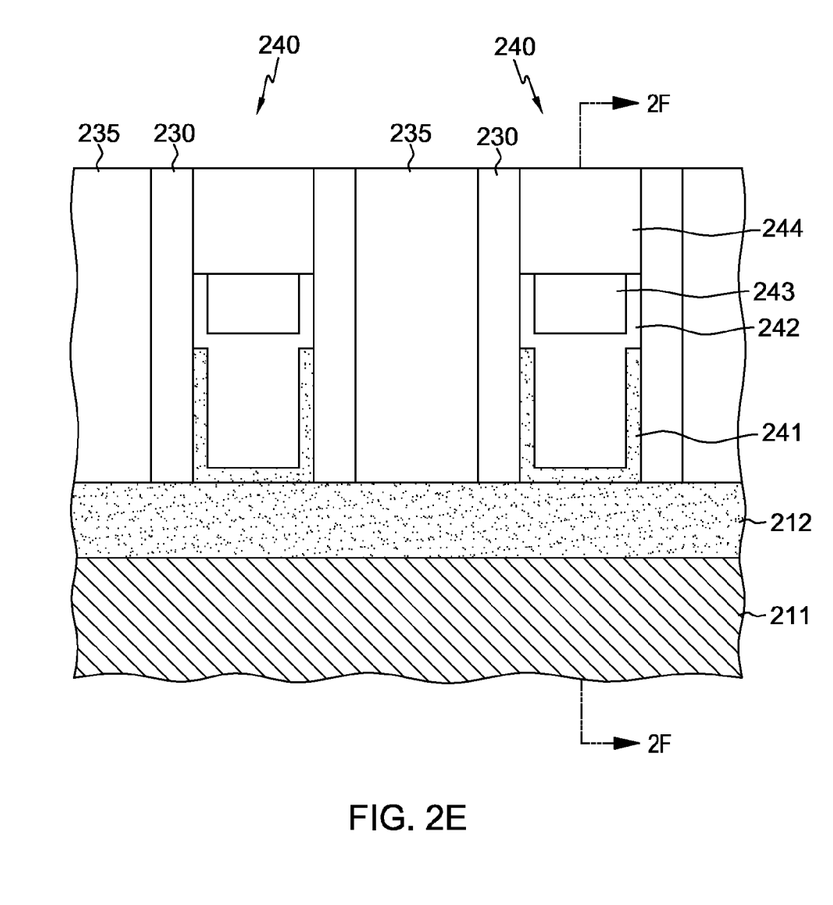
Figure 2F:
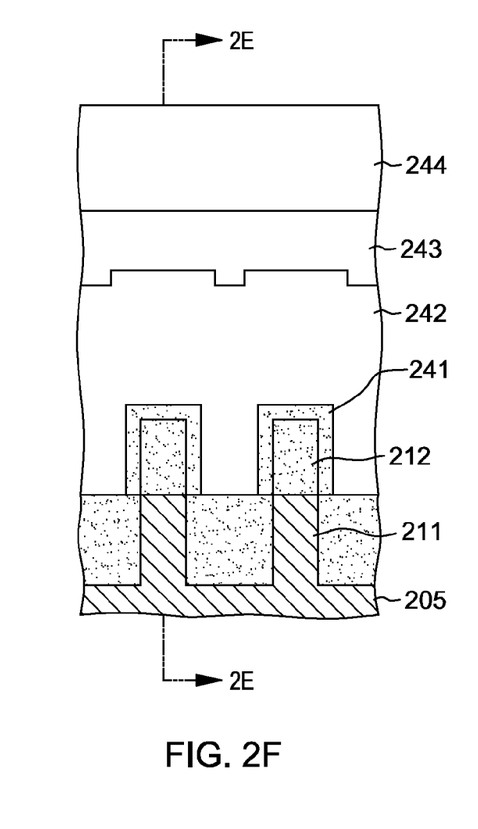
Figure 2G:
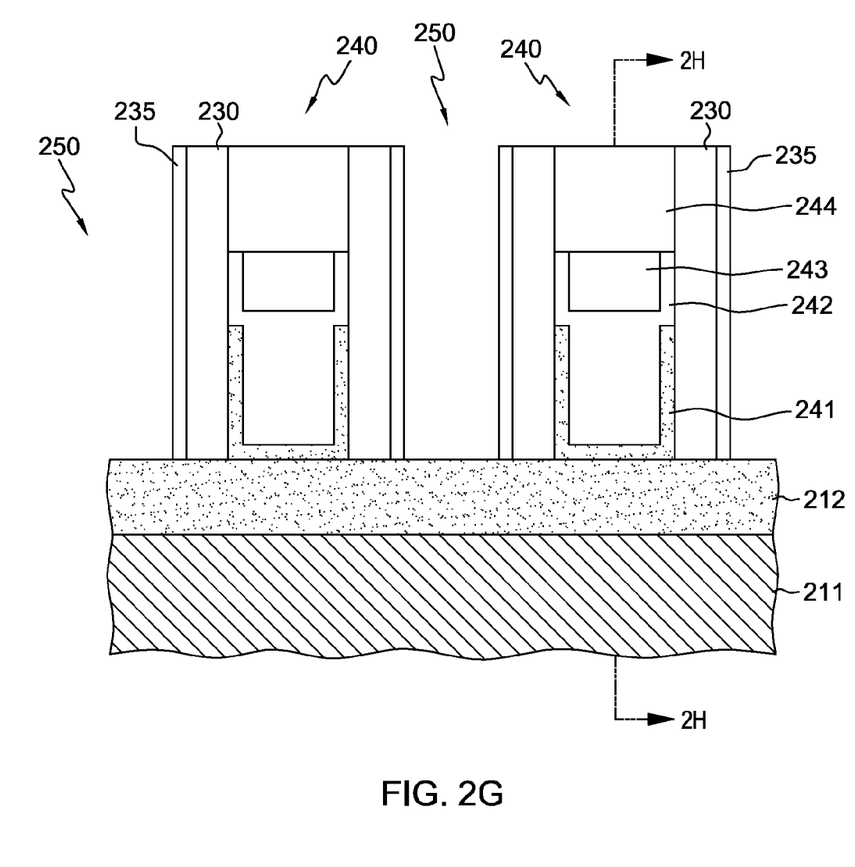
Figure 2H:
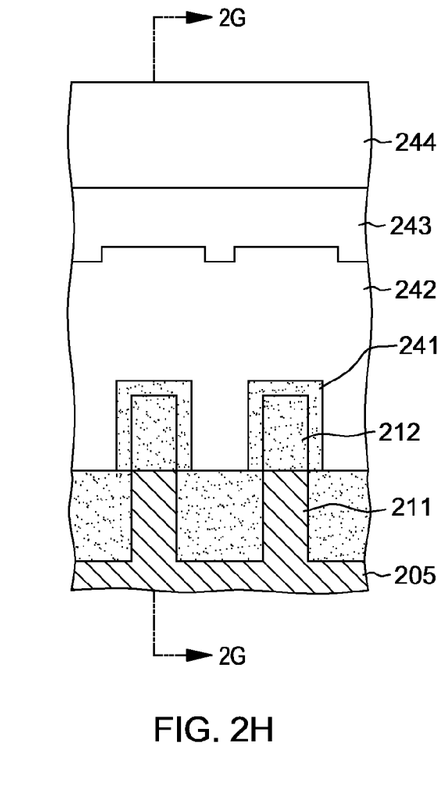
Figure 2I:
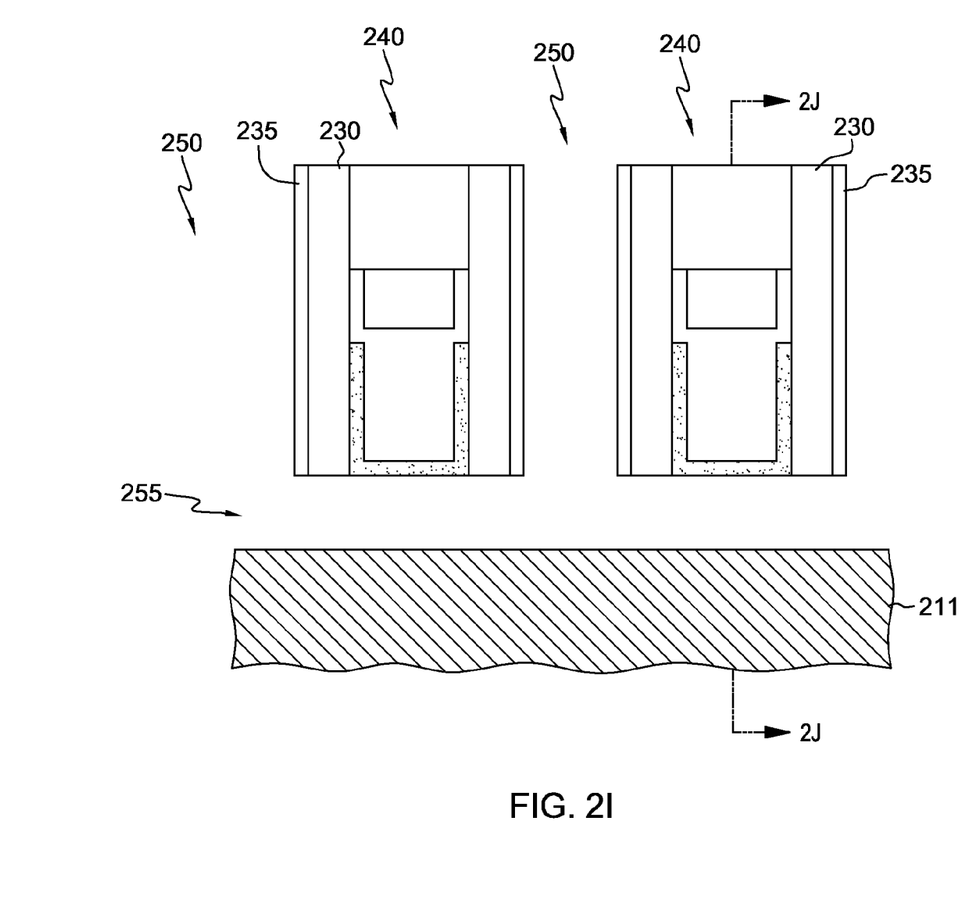
Figure 2J:
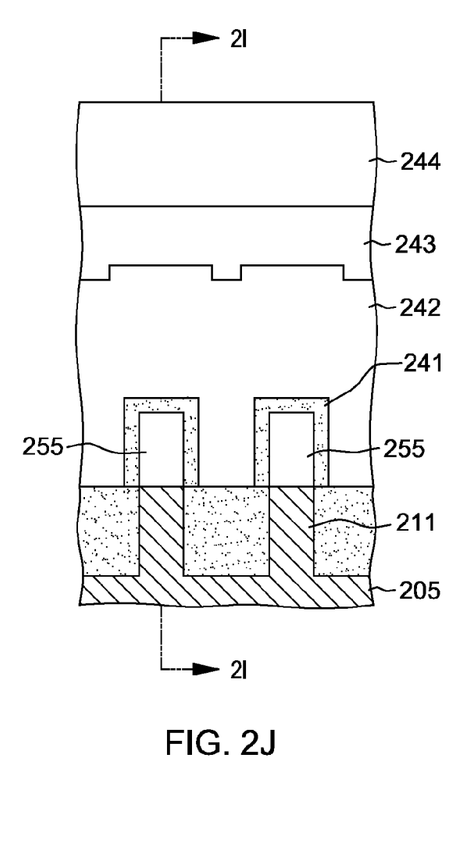
Figure 2K:
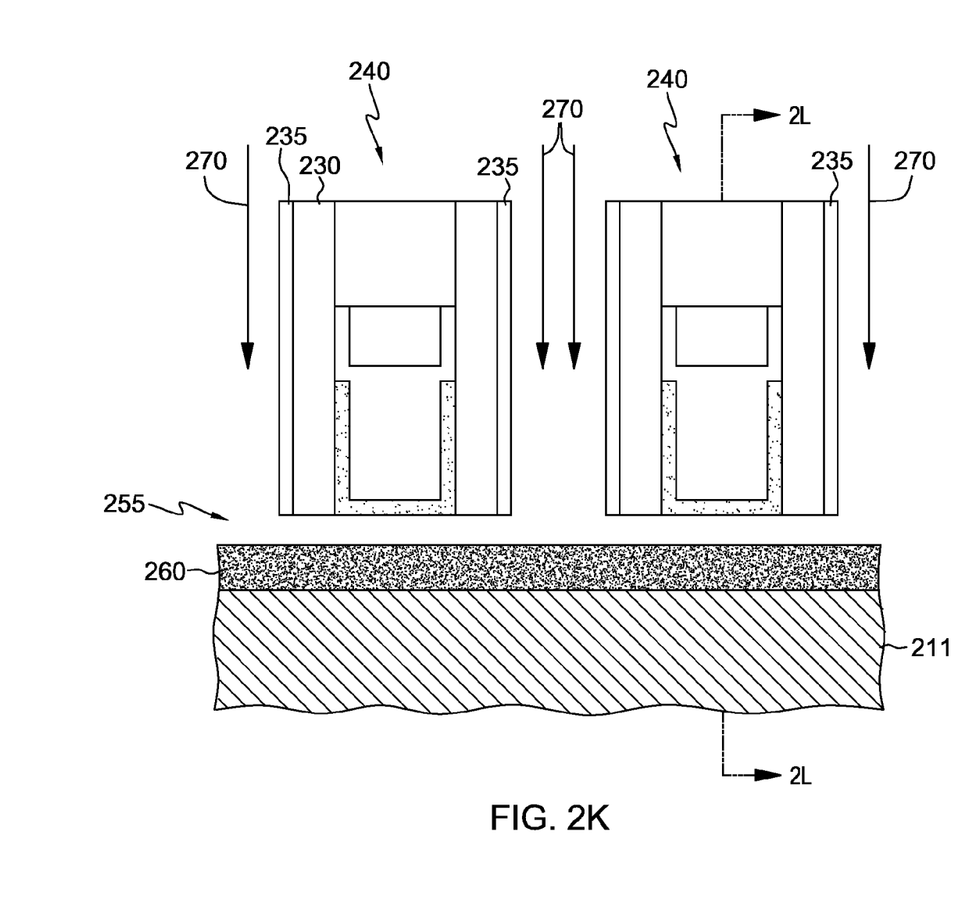
Figure 2L:
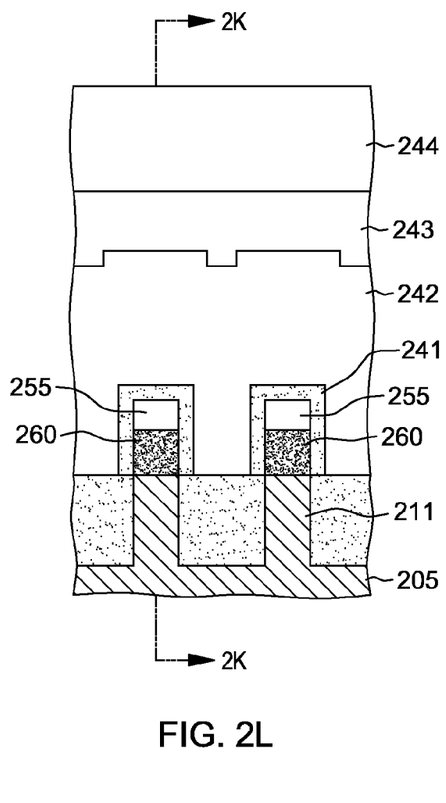
Figure 2M:
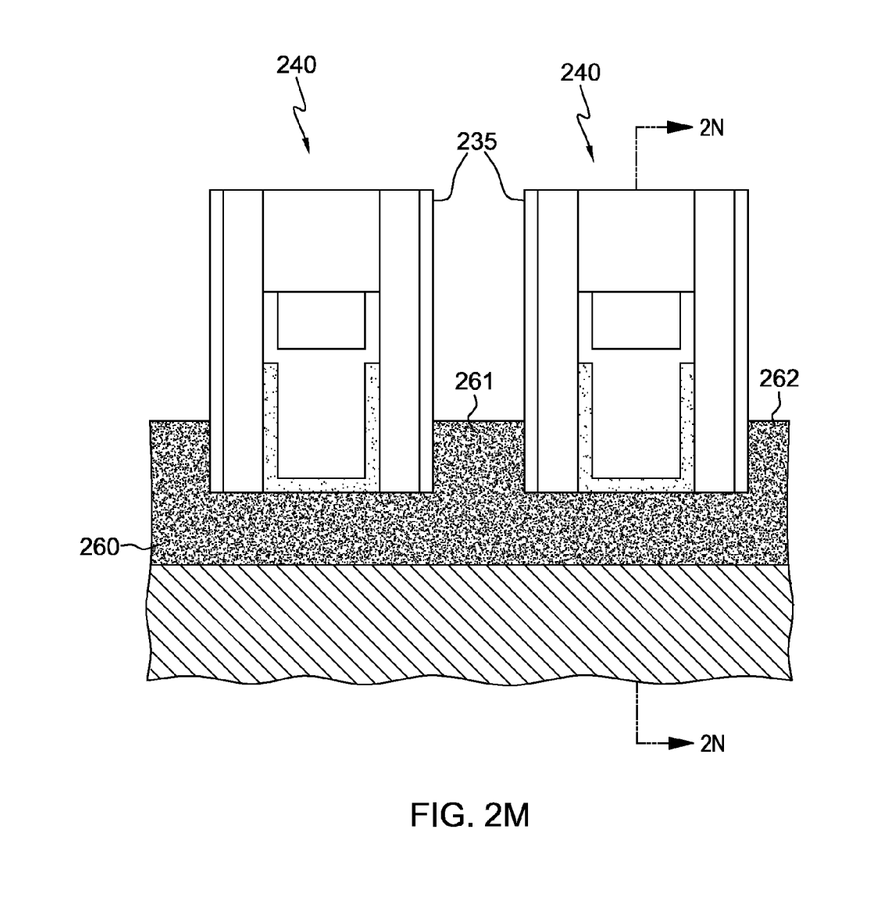
Figure 2N:
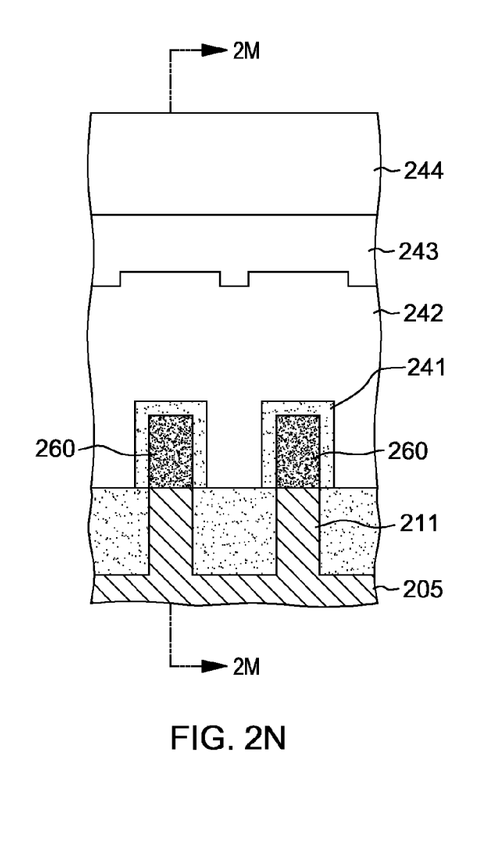
Figure 2O:
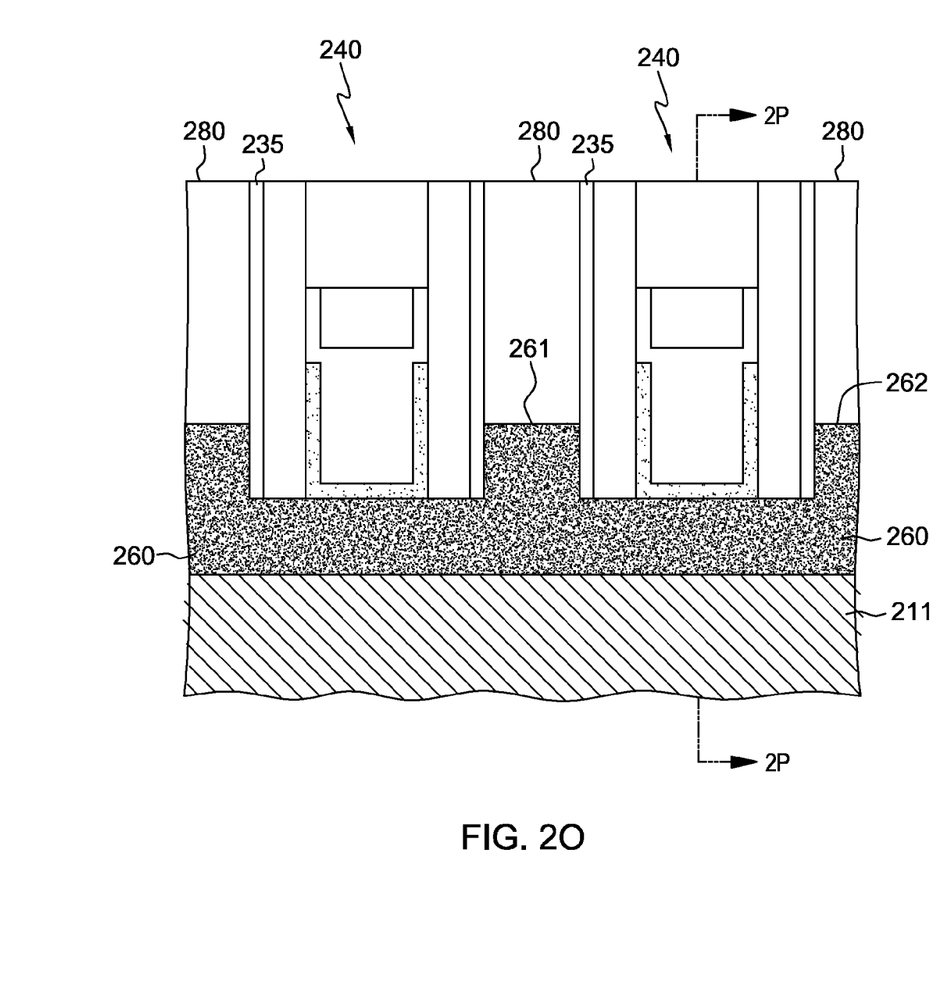
Figure 2P:
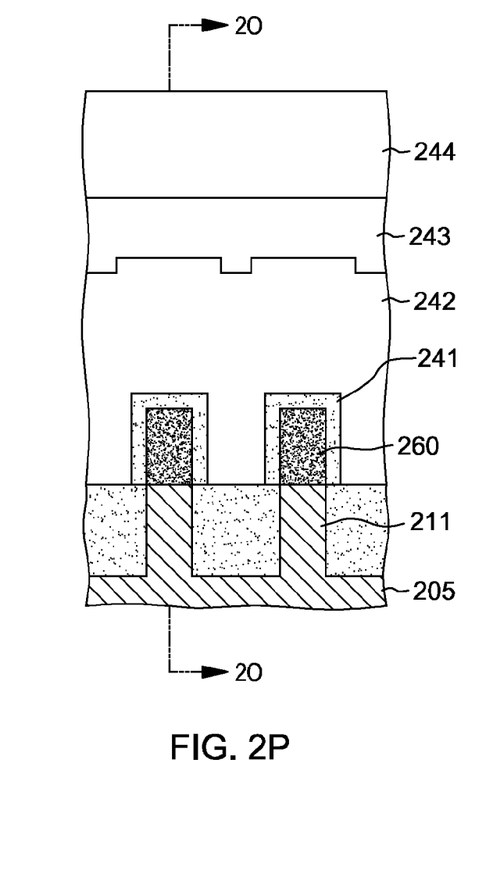

FIGS. 2A-2P depict one exemplary embodiment of the process illustrated in FIG. 1. FIGS. 2A and 2B depict a structure including a fin 210 formed above a substrate 205, the fin having a lower fin portion 211 and an upper fin portion 212. FIG. 2A depicts a cross-sectional view of fin 210 parallel to the length of fin 210, and FIG. 2B depicts a cross-sectional view of fin 210 perpendicular to the length of fin 210; FIG. 2B thus depicts a cross-section of FIG. 2A, and vice versa. Upper fin portion 212 may include a sacrificial material different from the material of lower fin portion 211. In one exemplary embodiment, the sacrificial material may be an amorphous semiconductor material, such as amorphous silicon, and lower fin portion 211 may include a mono-crystalline or poly-crystalline material, such as mono-crystalline or poly-crystalline silicon. In another exemplary embodiment, lower fin portion 211 may include silicon and upper fin portion 212 may include crystalline silicon-germanium as the sacrificial material. Generally, the sacrificial material of upper fin portion 212 may be a material that may be etched and removed without etching the material of lower fin portion 211, as further described herein. As FIG. 2B illustrates, a plurality of fins 210 may be formed above substrate 205. Fins 210 may be electrically isolated from each other by a dielectric material 206, such as an oxide-based compound, disposed between fins 210.

FIG. 2C and FIG. 2D depict the structure of FIG. 2A and FIG. 2B, respectively, following formation of a gate structure 220 over fin 210. Gate structure 220 may, in exemplary embodiments, be a sacrificial gate structure including a sacrificial gate material 221 over an insulating layer 222. Sacrificial gate material 221 may, for example, include amorphous silicon or other sacrificial material that may be selectively removed and replaced. Insulating layer 222 may, in exemplary embodiments, be an oxide-based compound or other similar dielectric material that facilitates electrical isolation of fin 210 from gate structure 220. Gate structure 220 may further include spacers 230 disposed over sidewalls of sacrificial gate material 221. Spacers 230 may remain in place during subsequent processing in which sacrificial gate material 221 is removed, so that replacement metal gate structures may be formed between spacers 230. Spacer material 230 may, for example, be a nitride-based compound such as silicon nitride. As FIG. 2C depicts, gate structure 220 may be one gate structure of a plurality of gate structures 220, and a dielectric material 235 may further be provided between the plurality of gate structures 220. Dielectric material 235 may electrically isolate the plurality of gate structures 220 from each other. Generally, dielectric material 235 may be a different material from the material of spacers 230, so that processes selected to affect one type of material will leave the other material unaffected. For example, if spacers 230 include a nitride material, dielectric material 235 may be an oxide material.

FIG. 2E and FIG. 2F depict the structure of FIG. 2C and FIG. 2D, respectively, following removal of the gate structure 220, including removal of the sacrificial gate material, and formation of a replacement metal gate (RMG) structure 240 in place of the sacrificial gate structure. Replacement metal gate structure 240 may include, by way of example only, a gate dielectric 241, a work-function layer 242, a gate metal 243, and a gate cap 244. Gate dielectric 241 may be, in one example, a high k dielectric material such as, for instance, hafnium-oxide or zirconium-oxide. Work-function layer 242 may include, for instance, a refractory metal-nitride such as titanium nitride, tantalum nitride, and the like. Gate metal 243 may include a metal, such as tungsten. Gate cap 244 may, for example, may include a nitride-based compound, such as silicon nitride. It will be understood by those with skill in the art that FIGS. 2E and 2F depict only one possible exemplary replacement metal gate structure 240, and that many alternative replacement metal gate structures may possibly be formed, including replacement gate structures using alternative materials.

FIGS. 2G and 2H depict the structure of FIG. 2E and FIG. 2F, respectively, following etching of a plurality of holes 250 through the dielectric material 235 to expose upper surfaces of the upper fin portion 212 external the plurality of gate structures 240. In general, any anisotropic etching process may be used to form holes 250 in dielectric material 235, such as reactive-ion etching (RIE) processes.

FIGS. 2I and 2J depict the structure of FIGS. 2G and 2H, respectively, with the upper fin portion selectively removed from over lower fin portion 211. Selective removal of the upper fin portion results in a tunnel 255 being formed between gate structure 240 and lower fin portion 211. Selective removal of the upper fin portion may, in exemplary embodiments, include exposing the exposed upper surfaces of the upper fin portion, via etched holes 250, to an etchant selected to etch the sacrificial material of the upper fin portion without etching the material of lower fin portion 211. Those with skill in the art will recognize that the concentration of the etchant, as well as the exposure time of the etchant, may be chosen to help ensure that little or no material of lower fin portion 211 is etched off, as certain etchants may affect both the sacrificial material and the material of lower fin portion 211, although at different reaction rates.

For example, the sacrificial material of the upper fin portion may be an amorphous semiconductor material, such as amorphous silicon, and lower fin portion 211 may be a mono-crystalline or poly-crystalline semiconductor material, such as poly-crystalline silicon. The etchant may be hot ammonia, for instance, as hot ammonia may etch amorphous silicon at a significantly faster rate than mono- or poly-crystalline silicon.

In another example, the sacrificial material of the upper fin portion may be silicon-germanium and lower fin portion 211 may be silicon. The etchant may be hydrochloric acid, for instance, as HCl generally etches silicon-germanium at a significantly higher rate than it etches silicon. It will be noted by those with skill in the art that many other combinations of sacrificial material and lower fin portion 211 material, as well as many other etchants, may equivalently be used in the processes disclosed herein.

FIGS. 2I and 2L depict the structure of FIGS. 2I and 2J, respectively, during provision 270 of a channel material 260 in tunnel 255, so that the channel material forms a channel region of gate structure 240 as further described below. Channel material 260 may, in exemplary embodiments, be a crystalline semiconductor material, and may be provided by an epitaxial growth process 270 that allows channel material 260 to grow with a crystalline structure over lower fin portion 211. Exemplary channel materials may include, but are not limited to, silicon-germanium or a III-V material. Channel material 260 may also include a dopant. The doping concentration of the dopant in the alternative channel material may be relatively high in order to facilitate formation of a junctionless FinFET structure, as described further below. As lower fin portion 211 may be a semiconductor material, such as mono- or poly-crystalline silicon, and gate structures 240 may be insulated by dielectric material 235 on outer surfaces of gate structures 240, the growth rate of crystalline semiconductor material 260 may be made substantially higher over the semiconductor material of lower fin portion 211 than on dielectric material 235. Thus, channel material 260 may selectively fill in tunnel 255 to form the channel region while outer surfaces of gate structures 240 may remain substantially deposition free (i.e., few or no unwanted growth nodules) following the epitaxial growth process 270.

To ensure that outer surfaces 235 of gate structure 240 remain free of epitaxial growth defects, the epitaxial growth process 270 may be accomplished via provision of a precursor that includes both the crystalline semiconductor material and a growth inhibitor material, such as a chlorine-based inhibitor compound. The growth inhibitor may at least reduce the growth rate of the channel material on dielectric material 235, and may also act to reduce the growth rate of the channel material on lower fin portion 211. However, as the growth rate of the channel material 260 may be significantly higher over the semiconductor material of lower fin portion 211 than on the dielectric material 235, the presence of the growth inhibitor in the precursor may not prevent growth of the channel material 260 in the tunnel 260 but may prevent growth on the outer surfaces of the gate structures 240. Ideally, in one exemplary embodiment, the growth inhibitor may be configured to reduce the growth rate of the channel material on dielectric material 235 to zero.

FIG. 2M and FIG. 2N depict the structure of FIGS. 2K and 2L, respectively, following completion of the provision of the channel material 260. As FIG. 2L depicts, channel material 260 may fill the tunnel depicted in FIGS. 2K and 2L, defining the channel region of gate structure 240. The epitaxial growth process 270 depicted by FIG. 2K may also provide the channel material over a first part of lower fin portion 211 external to a first side of gate structure 240 and over a second part of lower fin portion 211 external to a second side of gate structure 240. The channel material provided over the first part of lower fin portion 211 may form a source region 261, while the channel material provided over the second part of lower fin portion 211 may form a drain region 262 of a transistor structure. Source region 261 and drain region 262 may contact the channel region 260 below gate structure 240, so that the channel material of source region 261, drain region 262, and channel region 260 together form, in part, a junctionless FinFET structure. The epitaxial growth process depicted by FIG. 2K may be allowed to continue long enough to allow the channel material of source region 261 and drain region 262 to grow to a height higher than the channel region 260, and may thus form a raised source region 261 and raised drain region 262.

FIGS. 2O and 2P depict the structure of FIGS. 2M and 2N, respectively, following provision of a conductive material 280, such as tungsten, over source region 261 and drain region 262. Deposition of conductive material 280 may, in alternative embodiments, be preceded by silicide formation. Conductive material 280 may thus facilitate electrical contact between the material of the source region 261 and the material of the drain region 262 to a metal layer of a circuit structure (not depicted herein).

Thus, the methods described herein allow for provision of a desired channel material, such as doped silicon-germanium or a III-V channel material, after gate structures have been formed and other transistor structure formation processes have been carried out, so that the channel material may not be exposed to processes that would otherwise damage or destroy the channel material. As FIGS. 2M-2P illustrate, the channel material may be introduced just before conductive contact formation, which may be the final step in transistor structure formation prior to provision of metal layers.

However, as those with skill in the art will appreciate, the methods described herein may allow for provision of the desired channel material at any stage of transistor structure formation if some portion of upper surfaces of the upper fin portion 212, as depicted in FIG. 2G, is exposed to allow for exposure of the sacrificial material of upper fin portion 212 to an etchant. As depicted by FIGS. 2A-2P, selective removal of upper fin portion 212 may be performed after a sacrificial gate structure has been removed and a replacement metal gate structure has been formed. In one alternative embodiment, selective removal of upper fin portion 212 may be performed after a sacrificial gate structure has been removed and prior to provision of a replacement gate structure, depending in part on the desired channel material and the processing required for forming the replacement gate structure. Other alternative embodiments may also be possible and are contemplated within the scope of the present disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
    facilitating fabricating a transistor structure, the facilitating fabricating comprising:
        forming a fin above a substrate, the fin having a lower fin portion and an upper fin portion, the upper fin portion comprising a sacrificial material;
        forming a gate structure over the fin, wherein the gate structure is one gate structure of a plurality of gate structures over the fin;
        providing a dielectric material between the plurality of gate structures, the dielectric material electrically isolating the plurality of gate structures;
        etching a plurality of holes through the dielectric material to expose upper surfaces of the upper fin portion external the plurality of gate structures;
        selectively removing the upper fin portion, the selectively removing forming a tunnel between the gate structure and the lower fin portion; and
        providing a channel material in the tunnel, the channel material forming a channel region of the gate structure.

2. The method of claim 1, further comprising providing the channel material over a first part of the lower fin portion external a first side of the gate structure and over a second part of the lower fin portion external a second side of the gate structure, the channel material over the first part of the lower fin portion forming a source region of the transistor structure contacting the channel region, and the channel material over the second part of the lower fin portion forming a drain region of the transistor structure contacting the channel region.

3. The method of claim 2, wherein the channel material comprising the source region, the drain region, and the channel region forms, at least in part, a junctionless FinFET structure.

4. The method of claim 2, further comprising providing a conductive material over the source region and the drain region, the conductive material facilitating electrical contact between the channel material of the source region and the channel material of the drain region to a metal layer of the transistor structure.

5. The method of claim 1, wherein the sacrificial material of the upper fin portion comprises an amorphous semiconductor material and the lower fin portion comprises a mono-crystalline or poly-crystalline semiconductor material, and the selectively removing comprises exposing the exposed upper surfaces of the upper fin portion to an etchant selected to etch the amorphous semiconductor material without etching the mono-crystalline or poly-crystalline semiconductor material.

6. The method of claim 5, wherein the amorphous semiconductor material comprises amorphous silicon.

7. The method of claim 6, wherein the etchant comprises hot ammonia.

8. The method of claim 1, wherein the sacrificial material of the upper fin portion comprises a poly-crystalline semiconductor material and the lower fin portion comprises a mono-crystalline semiconductor material, and the selectively removing comprises exposing the exposed upper surfaces of the upper fin portion to an etchant selected to etch the poly-crystalline semiconductor material without etching the mono-crystalline semiconductor material.

9. The method of claim 1, wherein the sacrificial material of the upper fin portion comprises crystalline silicon-germanium and the lower fin portion comprises silicon, and the selectively removing comprises exposing the exposed upper surfaces of the upper fin portion to an etchant selected to etch silicon-germanium without etching silicon.

10. The method of claim 9, wherein the etchant comprises hydrochloric acid.

11. The method of claim 1, wherein providing the channel material comprises epitaxially growing the channel material, and wherein the lower fin portion comprises a semiconductor material, the gate structure comprises the dielectric material on a plurality of outer surfaces of the gate structure, and the channel material comprises a crystalline semiconductor material, wherein a growth rate of the crystalline semiconductor material on the semiconductor material is higher than a growth rate of the crystalline semiconductor material on the dielectric material.

12. The method of claim 11, wherein epitaxially growing the channel material comprises providing a precursor over the lower fin portion, the precursor comprising the channel material and a growth inhibitor material, the growth inhibitor material reducing the growth rate of the channel material on the dielectric material.

13. The method of claim 12, wherein the growth inhibitor material reduces the growth rate of the channel material on the dielectric material to zero.

14. The method of claim 12, wherein the growth inhibitor material comprises a chlorine-based inhibitor.

15. The method of claim 11, wherein the crystalline semiconductor material comprises silicon-germanium.

16. The method of claim 11, wherein the crystalline semiconductor material comprises a III-V material.

17. The method of claim 11, wherein the crystalline semiconductor material further comprises a dopant.

18. The method of claim 1, wherein the gate structure is a replacement metal gate structure, and wherein selectively removing the upper fin portion is performed subsequent to forming the replacement metal gate structure.

19. The method of claim 1, wherein the gate structure is a sacrificial gate structure, the method further comprising removing the sacrificial gate structure and providing a replacement metal gate structure subsequent to selectively removing the upper fin portion.

* * * * *